United States Patent
Hwang (10) Patent No.: US 9,160,455 B2
(45) Date of Patent: Oct. 13, 2015

(54) EXTERNAL CAVITY LASER ARRAY SYSTEM AND WDM OPTICAL SYSTEM INCLUDING SAME

(75) Inventor: Wen-Yen Hwang, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 193 days.

(21) Appl. No.: 13/595,505

(22) Filed: Aug. 27, 2012

(65) Prior Publication Data

US 2013/0223844 A1    Aug. 29, 2013

Related U.S. Application Data (60) Provisional application No. 61/527,587, filed on Aug. 25, 2011.

(51) Int. Cl.
*H01S 5/00* (2006.01)
*H04B 10/572* (2013.01)
*H04B 10/50* (2013.01)
(Continued)

(52) U.S. Cl.
CPC .............. *H04B 10/572* (2013.01); *H01S 5/146* (2013.01); *H04B 10/503* (2013.01); *H04B 10/506* (2013.01); *H04J 14/02* (2013.01); *H04J 14/025* (2013.01); *H04J 14/0246* (2013.01); *H04J 14/0282* (2013.01); *H01S 3/1055* (2013.01); *H01S 5/0268* (2013.01); *H01S 5/0612* (2013.01);
(Continued)

(58) Field of Classification Search
CPC ....... H04B 10/572; H01S 5/141; H01S 5/146; H01S 3/08

USPC .......................... 372/121, 50.121; 398/91, 79
See application file for complete search history.

(56) References Cited

U.S. PATENT DOCUMENTS 4,786,132 A    11/1988   Gordon
5,042,898 A     8/1991   Morey et al.
(Continued)

FOREIGN PATENT DOCUMENTS

JP    2000174397 A    6/2000
KR   20000049869 A    8/2000
(Continued)

OTHER PUBLICATIONS

US Office Action mailed May 28, 2014, received in related U.S. Appl. No. 13/543,259, 23 pgs.

*Primary Examiner* — Tuan Nguyen
(74) *Attorney, Agent, or Firm* — Grossman Tucker Perreault & Pfleger, PLLC; Norman S. Kinsella (57) ABSTRACT

An external cavity laser array system may be used in a WDM optical system, such as a WDM-PON, for transmitting optical signals at multiple channel wavelengths. The system generally includes a plurality of laser emitters (e.g., gain chips) optically coupled to and separated from respective exit reflectors (e.g., tunable narrow-band reflectors), thereby forming an array of external cavity lasers with extended lasing cavities. The exit reflectors may be distributed Bragg reflectors (DBRs) located in the waveguides in an arrayed waveguide grating (AWG). The laser emitters emit a range of wavelengths including multiple channel wavelengths and the DBRs reflect a subset of channel wavelengths including at least a channel wavelength associated with the laser emitter such that lasing occurs at the subset of channel wavelengths. The AWG then filters the emitted laser light at the associated channel wavelengths.

10 Claims, 5 Drawing Sheets

(51) Int. Cl.
*H04J 14/02* (2006.01)
*H01S 5/14* (2006.01)
*H01S 3/1055* (2006.01)
*H01S 5/026* (2006.01)
*H01S 5/06* (2006.01)
*H01S 5/40* (2006.01)

(52) U.S. Cl.
CPC ............... *H01S 5/141* (2013.01); *H01S 5/4062* (2013.01); *H04J 2014/0253* (2013.01)

(56) References Cited

U.S. PATENT DOCUMENTS

| | | |
|---|---|---|
| 5,305,336 A | 4/1994 | Adar et al. |
| 5,499,256 A | 3/1996 | Bischel et al. |
| 5,732,102 A | 3/1998 | Bouadma |
| 5,757,828 A | 5/1998 | Ouchi |
| 5,937,120 A | 8/1999 | Higashi |
| 5,987,200 A | 11/1999 | Fleming et al. |
| 6,111,999 A | 8/2000 | Espindola et al. |
| 6,118,562 A | 9/2000 | Lee et al. |
| 6,188,705 B1 | 2/2001 | Krainak et al. |
| 6,275,629 B1 | 8/2001 | Eggleton et al. |
| 6,303,040 B1 | 10/2001 | Oh et al. |
| 6,411,746 B1 | 6/2002 | Chamberlain et al. |
| 6,480,513 B1 | 11/2002 | Kapany et al. |
| 6,625,182 B1 | 9/2003 | Kuksenkov et al. |
| 6,683,895 B2 | 1/2004 | Pilgrim et al. |
| 6,741,629 B1 | 5/2004 | Garnache et al. |
| 6,853,671 B2 | 2/2005 | Liu et al. |
| 6,917,636 B2 | 7/2005 | Blauvelt et al. |
| 6,920,159 B2 * | 7/2005 | Sidorin et al. ................ 372/102 |
| 6,973,106 B1 | 12/2005 | Chaoui |
| 7,027,469 B2 | 4/2006 | Sidorin et al. |
| 7,565,084 B1 | 7/2009 | Wach |
| 7,899,105 B1 | 3/2011 | Hargis et al. |
| 2002/0018507 A1 * | 2/2002 | Deacon .......................... 372/96 |
| 2004/0258360 A1 | 12/2004 | Lim et al. |
| 2005/0123300 A1 | 6/2005 | Kim et al. |
| 2005/0129402 A1 | 6/2005 | Kim et al. |
| 2005/0232314 A1 | 10/2005 | Hashimoto |
| 2006/0002443 A1 | 1/2006 | Farber et al. |
| 2006/0182446 A1 * | 8/2006 | Kim et al. ....................... 398/72 |
| 2007/0160106 A1 * | 7/2007 | Hunter et al. ................. 372/102 |
| 2007/0264020 A1 | 11/2007 | Li et al. |
| 2010/0208756 A1 | 8/2010 | Noh |
| 2010/0232458 A1 | 9/2010 | Kim et al. |

FOREIGN PATENT DOCUMENTS

| | | |
|---|---|---|
| KR | 20000051030 A | 8/2000 |
| WO | 03012936 A2 | 2/2003 |

* cited by examiner

EXTERNAL CAVITY LASER ARRAY SYSTEM AND WDM OPTICAL SYSTEM INCLUDING SAME

CROSS-REFERENCE TO RELATED APPLICATIONS

The present application claims the benefit of U.S. Provisional Patent Application Ser. No. 61/527,587 filed on Aug. 25, 2011, which is fully incorporated herein by reference.

TECHNICAL FIELD

The present invention relates to wavelength division multiplexed (WDM) optical systems, networks, and methods and more particularly, to an external cavity laser array system for use therein.

BACKGROUND INFORMATION

Optical communications networks have been deployed for many years. Originally, these networks were generally "point to point" type networks including a transmitter and a receiver connected by an optical fiber. Such networks are relatively easy to construct but deploy many fibers to connect multiple users. As the number of subscribers connected to the network increases, the fiber count also increases rapidly and the expense of deploying and managing many fibers becomes complex and expensive.

A passive optical network (PON) addresses this problem by using a single "trunk" fiber from a transmitting end of the network, such as an optical line terminal (OLT), to a remote branching point, which may be up to 20 km or more. Each subscriber may be connected to the network utilizing a much shorter fiber span forming an architecture sometimes referred to as "tree and branch." One challenge in developing such a PON is utilizing the capacity in the trunk fiber efficiently in order to transmit the maximum possible amount of information on the trunk fiber.

To improve efficiency, PONs have used "time domain multiplexing" by assigning each subscriber on the PON a particular time slot for transmission of its data along the trunk fiber. Each subscriber is allowed to transmit during its assigned time slot, and these slots are synchronized at both the transmitter and receiver such that the receiver knows the time slot (and thus the transmitter) of a transmitted signal. In this way, many transmitters can share the same fiber without fear of multiple transmitters sending data at the same time and confusing the receiver. Standards such as gigabit PON (G-PON) and Ethernet-based PON (E-PON), for example, utilize this time-dependant approach.

Although TDM-PON systems work, the TDM approach is inefficient because the system should allow sufficient time between different transmitter time slots to prevent confusion at the receiving end. Also, noise in this type of system is cumulative across all the transmitters in the PON. To avoid unwanted noise, transmitters other than the one currently transmitting may be turned off and then turned on rapidly when it is time to transmit data, without providing much stabilization time. This "burst mode" transmission makes it challenging to increase data rates in a TDM-PON system.

TDM also does not make efficient use of the bandwidth available on the fiber. Optical fiber has the ability to carry many different signals simultaneously, without interfering, as long as these different signals are carried on different wavelengths. TDM-PON systems utilize only a few wavelengths and therefore do not utilize much of the fundamental bandwidth available on the optical fiber. Similar to radio transmissions utilizing different frequencies to carry different signals, fiber optic communications networks may increase the amount of information carried on a single optical fiber by multiplexing different optical signals on different wavelengths using wavelength division multiplexing (WDM).

In a WDM-PON, a single trunk fiber carries data to and from an optical branching point and the branching point provides a simple routing function by directing signals of different wavelengths to and from individual subscribers. In this case, each subscriber is assigned a particular wavelength on which to send and/or receive data. The WDM-PON thus allows much greater bandwidth because each transmitter is allowed to transmit at a higher data rate and for a longer period of time.

A challenge in a WDM-PON, however, is designing a network that will allow the same transmitter to be used in an optical networking terminal (ONT) at any subscriber location. For ease of deployment and maintenance in a WDM-PON, it is desirable to have a "colorless" ONT whose wavelength can be changed or tuned such that a single device could be used in any ONT on the PON. With a "colorless" ONT, an operator only needs to have a single, universal transmitter or transceiver device that can be employed at any subscriber location.

One or more tunable laser sources may be used to provide multiple optical signals at different wavelengths in a WDM system or network such as a WDM-PON. Similar to a tuner section of a radio transmitter allowing the transmitter to select the frequency on which to transmit, a tunable laser has the capability to select different wavelengths on which to transmit optical signals. Various different types of tunable lasers have been developed over the years, but most of these were developed for high-capacity backbone connections to achieve high performance and at a relatively high cost. Many tunable laser sources rely on continuous tuning mechanisms and may be difficult and expensive to construct because of extremely tight manufacturing tolerances. Many continuously tunable lasers also require an external means to "lock" the wavelength similar to a phase-locked loop or crystal reference oscillator in a radio tuner. These wavelength lockers are used because the continuously tunable designs are often highly sensitive to external conditions that can cause the wavelength to drift if not corrected. Conditions such as temperature or external electrical or magnetic fields, for example, can cause drift in some continuously-tunable laser designs.

Many WDM-PON applications have lower data rates and shorter transmission distances as compared to high-capacity, long-haul WDM systems, and thus a lower performance and lower cost laser may suffice. Also, continuous tuning may not be necessary in WDM-PON applications, although the ability to select a wavelength from among several wavelengths (e.g., in a grid of channel wavelengths) is desirable. In some of these applications, the wavelength may be selected only once in the lifetime of the laser (i.e., when it is initially installed) and this wavelength may not need to be changed again.

BRIEF DESCRIPTION OF THE DRAWINGS

These and other features and advantages will be better understood by reading the following detailed description, taken together with the drawings wherein.

DETAILED DESCRIPTION

An external cavity laser array system, consistent with embodiments disclosed herein, may be used in a WDM optical system, such as a WDM-PON, for transmitting optical signals at multiple channel wavelengths. The external cavity laser array system generally includes a plurality of laser emitters (e.g., gain chips) optically coupled to and separated from respective exit reflectors (e.g., narrow-band reflectors), thereby forming an array of external cavity lasers with extended lasing cavities. The extended lasing cavities narrow the mode spacing while maintaining a relatively small gain region in the laser emitter capable of higher speed optical modulation. In one embodiment, the exit reflectors may be distributed Bragg reflectors (DBRs) located in the waveguides in an arrayed waveguide grating (AWG). The laser emitters emit a range of wavelengths including multiple channel wavelengths and the DBRs reflect a subset of channel wavelengths including at least a channel wavelength associated with the laser emitter such that lasing occurs at the subset of channel wavelengths. The AWG then filters the emitted laser light at the associated channel wavelengths.

The narrow mode spacing may be less than a WDM channel width, and more specifically, may be less than a channel passband of an arrayed waveguide grating (AWG) or other filter used to select the channel wavelength. In a dense WDM (DWDM) 100 GHz system, for example, the narrow mode spacing may be less than the channel width of about 0.8 nm and more specifically less than a passband of about 0.4 nm and may be capable of relatively high speed optical modulation at a data rate of at least about 1 Gigabit per second (Gbps). Examples of WDM optical systems in which an external cavity laser array system may be used include the type disclosed in commonly-owned of U.S. patent application Ser. No. 13/543,259 and U.S. patent application Ser. No. 13/543,310, both of which are fully incorporated herein by reference.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. The term "narrow mode spacing" or "relatively narrow mode spacing" refers to a spacing of the longitudinal modes of the extended cavity of the FP laser assembly being less than the channel spacing in a WDM optical system such that multiple modes fit within a band of wavelengths associated with each channel. The term "high speed modulation" or "relatively high speed modulation" refers to optical modulation of the light emitted by the FP laser assembly at a data rate of at least about 1 Gbps. The term "narrow-band reflector" refers to a reflector that reflects a band of wavelengths with a relatively narrow bandwidth relative to the bandwidth of the system channel wavelengths, for example, 3 to 5 channel wavelengths on the ITU-T dense wavelength division multiplexing (DWDM) grid.

As used herein, "interchangeable" refers to transmitters that are not limited to transmitting at a particular channel wavelength and may be used in multiple different nodes or terminals of a WDM optical system such as a WDM passive optical network (PON) without having to be substantially reconfigured. Interchangeable transmitters may be, but are not necessarily, identical. The term "coupled" as used herein refers to any connection, coupling, link or the like by which signals carried by one system element are imparted to the "coupled" element and "optically coupled" refers to coupling such that light from one element is imparted to another element. Such "coupled" devices are not necessarily directly connected to one another and may be separated by intermediate components or devices that manipulate or modify such signals.

Figure 1:
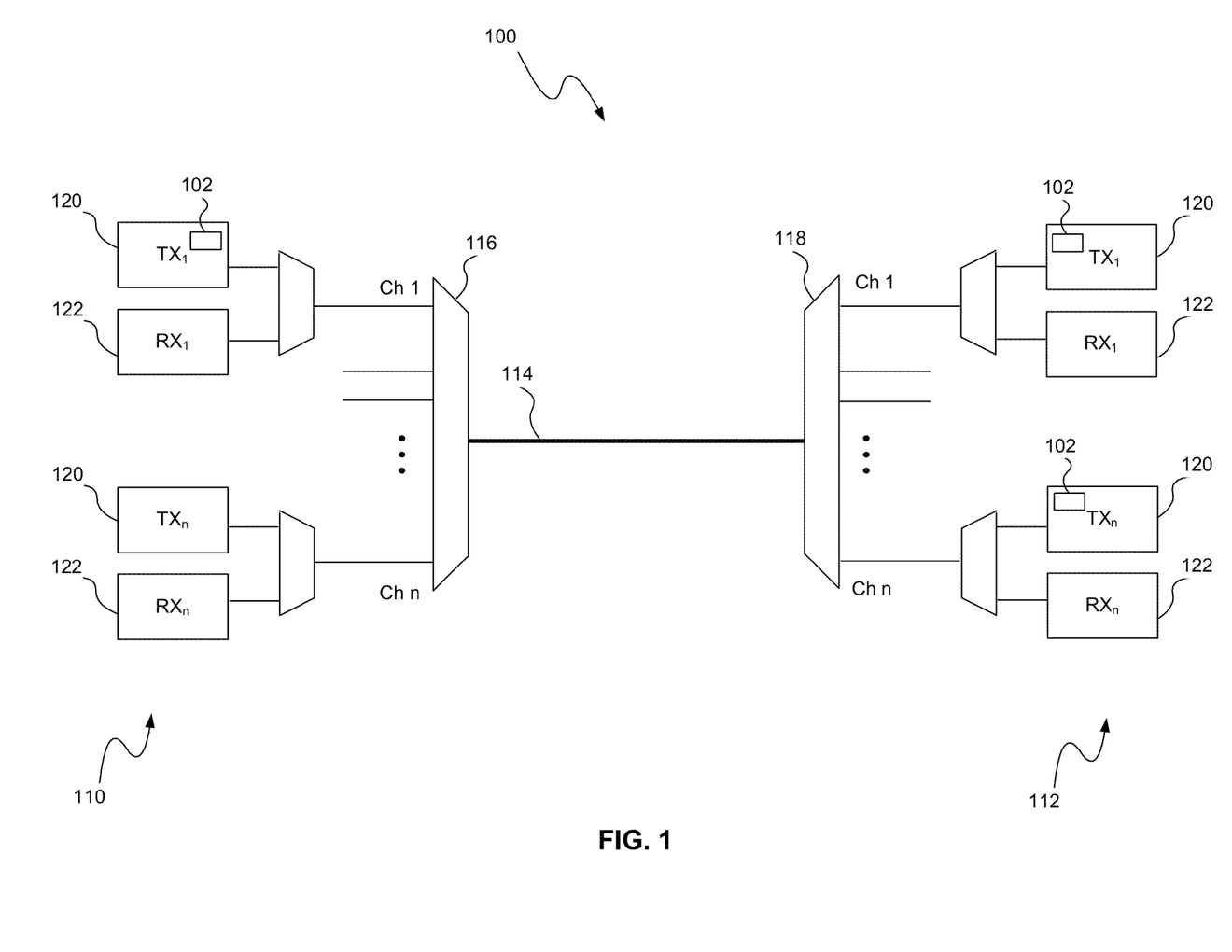
FIG. 1 is a diagrammatic view of a wavelength division multiplexed (WDM) optical communication system including an external cavity laser array system, consistent with an embodiment.

Referring to FIG. 1, a WDM optical communication system 100 including external cavity laser array systems, consistent with embodiments of the present disclosure, is shown and described. The WDM system 100 includes one or more terminals 110, 112 coupled at each end of a trunk optical fiber or path 114 for transmitting and receiving optical signals at different channel wavelengths over the trunk optical path 114. The terminals 110, 112 at each end of the WDM system 100 include one or more transmitters 120 (e.g., $TX_1$ to $TX_n$) and receivers 122 (e.g., $RX_1$ to $RX_n$) associated with different channels (e.g., Ch. 1 to Ch. n) for transmitting and receiving optical signals between the one or more terminals 110, 112. Each terminal 110, 112 may include one or more transmitters 120 and receivers 122, and the transmitters 120 and receivers 122 may be separate or integrated as a transceiver within a terminal.

Although each of the transmitters 120 is associated with different respective channels and channel wavelengths, one or more of the transmitters 120 may be configured to transmit optical signals at a plurality of channel wavelengths (e.g., a subset of the system channel wavelengths) instead of transmitting at only the associated channel wavelength. The multi-channel transmitters 120 may include external cavity lasers 102 capable of emitting light across a range of wavelengths including a subset of the system channel wavelengths (e.g., $\lambda_1$ to $\lambda_n$) used by the WDM system 100. The WDM system 100 filters the outputs from the multi-channel transmitters 120 to select the channel wavelengths associated with the respective transmitters for multiplexing and transmission on the trunk optical path 114. The external cavity laser 102 includes a separate exit reflector, such as a DBR, to form an extended laser cavity capable of relatively high speed optical modulation and a relatively narrow mode spacing such that multiple lasing modes fit within respective filter passbands when the associated wavelengths are selected.

Optical multiplexers/demultiplexers 116, 118 at each end of the WDM system 100 combine and separate the optical signals at the different channel wavelengths associated with the transmitters 120 and receivers 122. Aggregate WDM optical signals including the combined channel wavelengths are carried on the trunk optical path 114. The optical multiplexers 116, 118, for example, may include arrayed waveguide gratings (AWGs) that provide both filtering to select a different associated channel wavelength for each of the transmitters 120 and provide multiplexing to combine the selected associated channel wavelengths for transmission as a WDM signal over the optical path 114. Other types of filters may be used either in the optical multiplexers/demultiplexers 116, 118 or separately from the optical multiplexers/demultiplexers. By transmitting optical signals at multiple channel wavelengths and performing the wavelength selection separately from the multi-channel transmitters, the multi-channel transmitters are designed as universal transmitters capable of being used in different locations in the WDM system 100 and may be interchangeable with other multi-channel transmitters in the WDM system 100.

Figure 2:
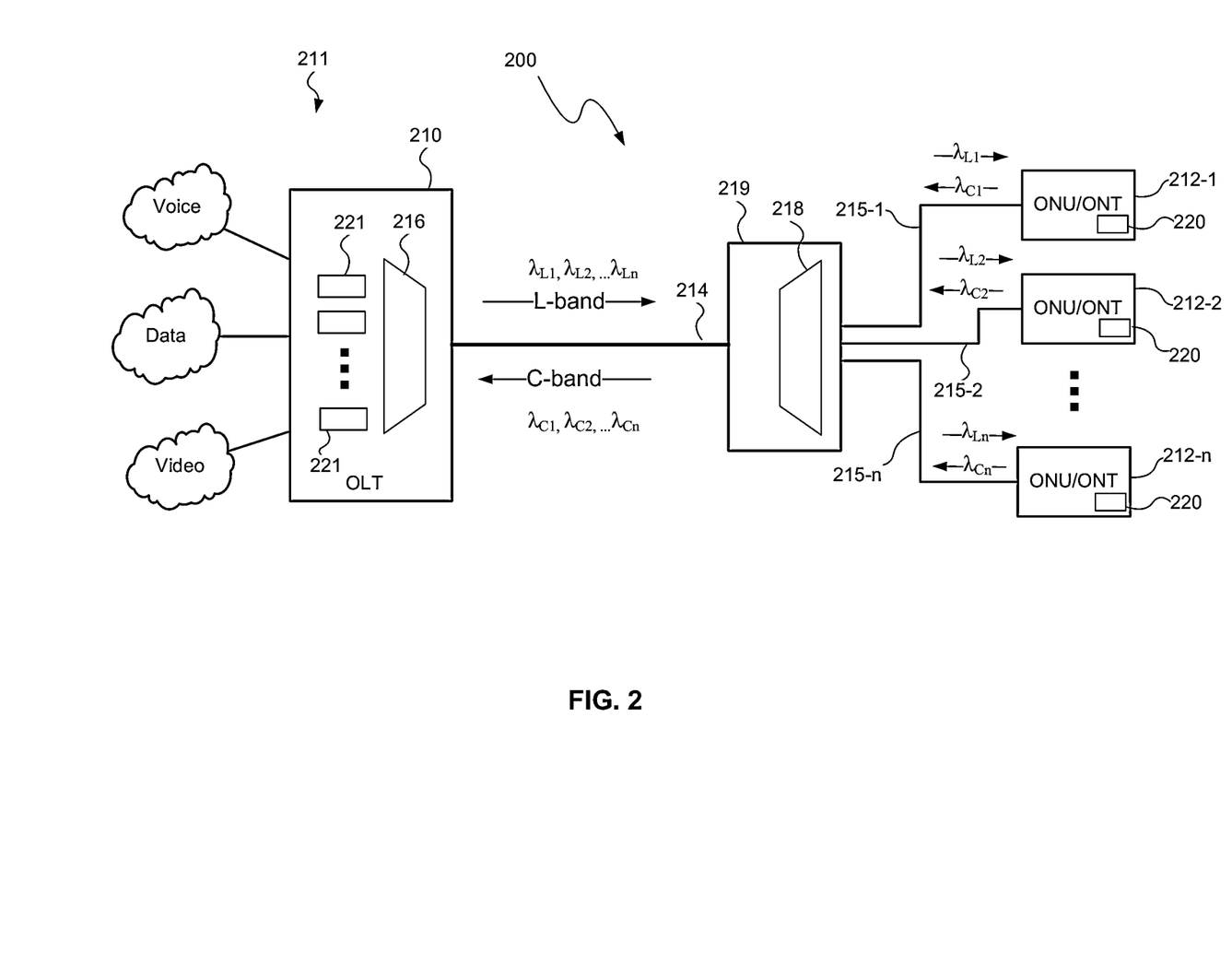
FIG. 2 is a diagrammatic view of a WDM passive optical network (PON) including an external cavity laser array system, consistent with an embodiment.

Referring to FIG. 2, an external cavity laser array system, consistent with embodiments of the present disclosure, may be used in a WDM-PON 200. The WDM-PON 200 provides a point-to-multipoint optical network architecture using a WDM system. According to one embodiment of the WDM-PON 200, a central office (CO) 211 including one or more optical line terminals (OLTs) 210 may be coupled to a plurality of optical networking terminals (ONTs) or optical networking units (ONUs) 212-1 to 212-$n$ via optical fibers, waveguides, and/or paths 214, 215-1 to 215-$n$. A branching point 219 couples the trunk optical path 214 to the separate optical paths 215-1 to 215-$n$ to the ONUs/ONTs 212-1 to 212-$n$ at the subscriber locations. The branching point 219 may include one or more passive coupling devices such as a splitter or optical multiplexer/demultiplexer. The ONUs/ONTs 212-1 to 212-$n$ may be located in homes, businesses or other types of subscriber location or premises.

The WDM-PON 200 may also include additional nodes or network devices, such as Ethernet PON (EPON) or Gigabit PON (GPON) nodes or devices, coupled between the branching point 219 and ONUs/ONTs 212-1 to 212-$n$ at different locations or premises. One application of the WDM-PON 200 is to provide fiber-to-the-home (FTTH) or fiber-to-the-premises (FTTP) capable of delivering voice, data, and/or video services across a common platform. In this application, the CO 211 may be coupled to one or more sources or networks providing the voice, data and/or video.

In the WDM-PON 200, different ONUs/ONTs 212-1 to 212-$n$ may be assigned different channel wavelengths and optical signals may be transmitted on the different channel wavelengths and combined and separated using WDM techniques. One or more of the ONUs/ONTs 212-1 to 212-$n$ may thus include a multi-channel transmitter 220 for generating an optical signal at multiple channel wavelengths and the branching point 219 may include an AWG 218 for selecting an associated one of the multiple channel wavelengths and for combining the selected associated channel wavelengths for transmission to the OLT 210. Thus, the same device in the WDM-PON node that provides wavelength routing may be used to provide the filtering and wavelength selection. The OLT 210 may also include one or more multi-channel transmitters 221 for generating optical signals at multiple channel wavelengths and an AWG 216 for selecting associated ones of the multiple channel wavelengths and for combining the selected associated channel wavelengths for transmission to the ONUs/ONTs 212-1 to 212-$n$.

In one embodiment, the WDM-PON 200 may use different wavelength bands for transmission of downstream and upstream optical signals relative to the OLT 210. For example, the L-band (e.g., about 1565 to 1625 nm) may be used for downstream transmissions and the C-band (e.g., about 1530 to 1565 nm) may be used for upstream transmissions. The ONUs/ONTs 212-1 to 212-$n$ may thus be assigned different channel wavelengths within the L-band and within the C-band. Transmitters in the OLT 210 may be configured to transmit optical signals on multiple channel wavelengths in the L-band, and transceivers or receivers located within the ONUs/ONTs 212-1 to 212-$n$ may be configured to receive an optical signal on at least one channel wavelength in the L-band. Transceivers or transmitters located within the ONUs/ONTs 212-1 to 212-$n$ may be configured to transmit optical signals on multiple channel wavelengths within the C-band. Other wavelengths and wavelength bands are also within the scope of the system and method described herein.

In the example embodiment, the multi-channel transmitters 221 in the OLT 110 may generate optical signals at a subset of the channel wavelengths in the L-band (e.g., $\lambda_{L1}$, $\lambda_{L2}$, ... $\lambda_{Ln}$). Each of the multi-channel transmitters 221 may include a laser emitter that emits a range of wavelengths including the channel wavelengths and is modulated by a respective RF signal to generate the respective optical signals. The AWG 216 may include integrated tunable narrow-band exit reflectors (e.g., DBRs) for reflecting a subset of channel wavelengths back to respective the laser emitters, thereby forming an array of extended cavity lasers. The AWG 216 also selects associated channel wavelengths (e.g., $\lambda_{L1}$, $\lambda_{L2}$, ... $\lambda_{Ln}$) for each of the respective transmitters 221 and combines the optical signals at the different associated channel wavelengths. The branching point 219 may demultiplex the downstream aggregate WDM optical signal (e.g., $\lambda_{L1}$, $\lambda_{L2}$, ... $\lambda_{Ln}$) from the OLT 210 for transmission of the separate channel wavelengths to the respective ONUs/ONTs 212-1 to 212-$n$. Alternatively, the branching point 219 may provide the aggregate WDM optical signal to each of the ONUs/ONTs 212-1 to 212-$n$ and each of the ONUs/ONTs 212-1 to 212-$n$ separates and processes the assigned optical channel wavelength. The individual optical signals may be encrypted to prevent eavesdropping on optical channels not assigned to a particular ONU/ONT.

In the example embodiment, the multi-channel transmitters 220 in one or more of the ONUs/ONTs 212-1 to 212-$n$ may generate an optical signal at a subset of the channel wavelengths in the C-band (e.g., $\lambda_{C1}$, $\lambda_{C2}$, ... $\lambda_{Cn}$). Each of the multi-channel transmitters 220 may include a laser emitter that is modulated by a respective RF signal to generate the optical signal and a narrow-band exit reflector (e.g., a DBR), thereby forming an extended cavity laser in each of the transmitters 220. The AWG 218 in the branching point 219 selects associated channel wavelengths (e.g., $\lambda_{C1}$, $\lambda_{C2}$, ... $\lambda_{Cn}$) for each of the respective transmitters 220 and combines or multiplexes the upstream optical signals from the respective ONUs/ONTs 212-1 to 212-$n$ for transmission as an aggregate WDM optical signal over the trunk optical path 214 to the OLT 210.

Figure 3:
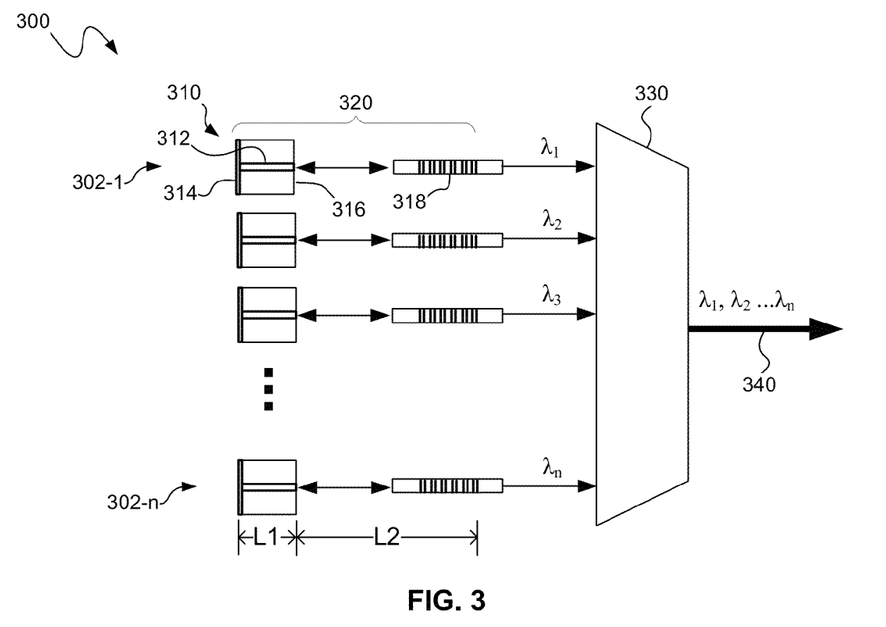
FIG. 3 is a schematic illustration of an external cavity laser array system, consistent with an embodiment.

As shown in FIG. 3, an external cavity laser array system 300, consistent with an embodiment, includes an array of external cavity lasers 302-1 to 302-$n$, which may be associated with respective channel wavelengths (e.g., $\lambda_1$, $\lambda_2$, ... $\lambda_n$) in a WDM optical system such as a WDM PON. Each of the external cavity lasers 302-1 to 302-$n$ include a laser emitter 310 and a narrow-band exit reflector 318 physically separated from the respective laser emitter 310 to form an extended laser cavity 320. Each of the external cavity lasers 302-1 to 302-$n$ generates at least an associated channel wavelength (e.g., $\lambda_1$, $\lambda_2$, ... $\lambda_n$) and may generate multiple channel wavelengths (e.g., a subset of the WDM system channel wavelengths) including the associated channel wavelength. An optical multiplexer 330 combines the associated wavelengths to produce an aggregate WDM optical signal 340. Each narrow-band exit reflector 318 may be integrated with the optical multiplexer 330 or separate from the optical multiplexer 330. In one embodiment, as will be described in greater detail below, the optical multiplexer 330 includes an AWG that provides filtering at the associated channel wavelengths such that the associated channel wavelengths are selected from the subset of channel wavelengths generated by the respective external cavity lasers 302-1 to 302-*n*.

The laser emitter 310 includes a gain region 312 (e.g., a gain chip) that generates and amplifies light across a range of wavelengths (i.e., including the channel wavelengths or at least a subset of the channel wavelengths) to provide the gain that results in lasing when the gain exceeds the cavity losses. The laser emitter 310 further includes a back reflector 314 on a back facet or side and an anti-reflective coating 316 on an opposite side optically coupled to the exit reflector 318. The back reflector 314 reflects light from the laser emitter 310 and the anti-reflective coating 316 allows light to pass into and out of the gain region 312 of the laser emitter 310. The extended lasing cavity 320 is thus formed between the back reflector 314 and the exit reflector 318.

The extended lasing cavity 320 provides a desired narrow mode spacing (e.g., $\Delta\lambda \approx 0.1$ nm) while allowing optical modulation at a data rate of 1 Gbps or greater. The total lasing cavity length is extended by the additional length ($L_2$) to the exit reflector 318 while maintaining a relatively short cavity length ($L_1$) for the gain region 312. For each of the external cavity lasers 302-1 to 302-*n*, the Fabry-Perot (FP) mode spacing may thus be determined as follows: $\Delta\lambda = \lambda^2/(2n_1L_1 + 2n_2L_2)$ where $n_1$ is the refractive index for the gain region, $n_2$ is the refractive index for air, $\lambda$ is a lasing wavelength, $L_1$ is the length of the gain region 312, and $L_2$ is the additional length of the external cavity portion. As a result, the shorter cavity length ($L_1$) for the gain region 312 enables high speed optical modulation (e.g., >1 Gbps) of the gain region 312 while the longer total lasing cavity length ($L_1+L_2$) enables a narrower mode spacing $\Delta\lambda$ (e.g., $\Delta\lambda << 0.4$ nm). In one example of an extended cavity FP laser assembly for use in a WDM-PON, the gain region length ($L_1$) is less than about 1000 μm and the additional length ($L_2$) is in a range of at least about 9 mm.

Each laser emitter 310 may include multiple quantum-well active regions or other gain media capable of emitting a spectrum of light across a range of wavelengths and capable of amplifying light reflected back into the gain media. The laser emitter 310 may be, for example, a gain chip such as a semiconductor diode, a reflective semiconductor optical amplifier (R-SOA), a super-luminescent light emitting diode, or other light emitting modules. In some embodiments, the laser emitter 310 may be capable of emitting a range of wavelengths across the full spectrum of channel wavelengths in a WDM optical system (e.g., the C-band, the L-band, or both) or a subset of channel wavelengths in the WDM optical system.

The back reflector 314 may be highly reflective (e.g., at least 80% reflective) and may include a cleaved facet on a laser or gain chip, a reflective coating on the chip, or a distributed Bragg reflector (DBR) on the gain chip or separate from the gain chip. In one embodiment, the back reflector 314 may be about 80-90% reflectivity to allow a portion of light to pass through the back for sensing by a monitor photodiode (not shown). The anti-reflective coating 316 may include a high quality anti-reflective (AR) coating on the other facet of the gain chip such light passes out of the gain region 312 without reflection or with a reflectivity as small as possible (e.g., less than 1% reflective).

The narrow-band exit reflector 318 may include, for example, a DBR. The narrow-band exit reflector 318 is sufficiently partially reflective (e.g., about 50% reflectivity) at a reflection band to achieve lasing at a range of wavelengths in the reflection band. The range of wavelengths in the reflection band include at least the associated channel wavelength associated with the external cavity laser including the exit reflector 318. The narrow-band exit reflector 318 may also be tunable, for example, thermally tunable using a temperature controller (not shown in FIG. 3).

Figure 3A:
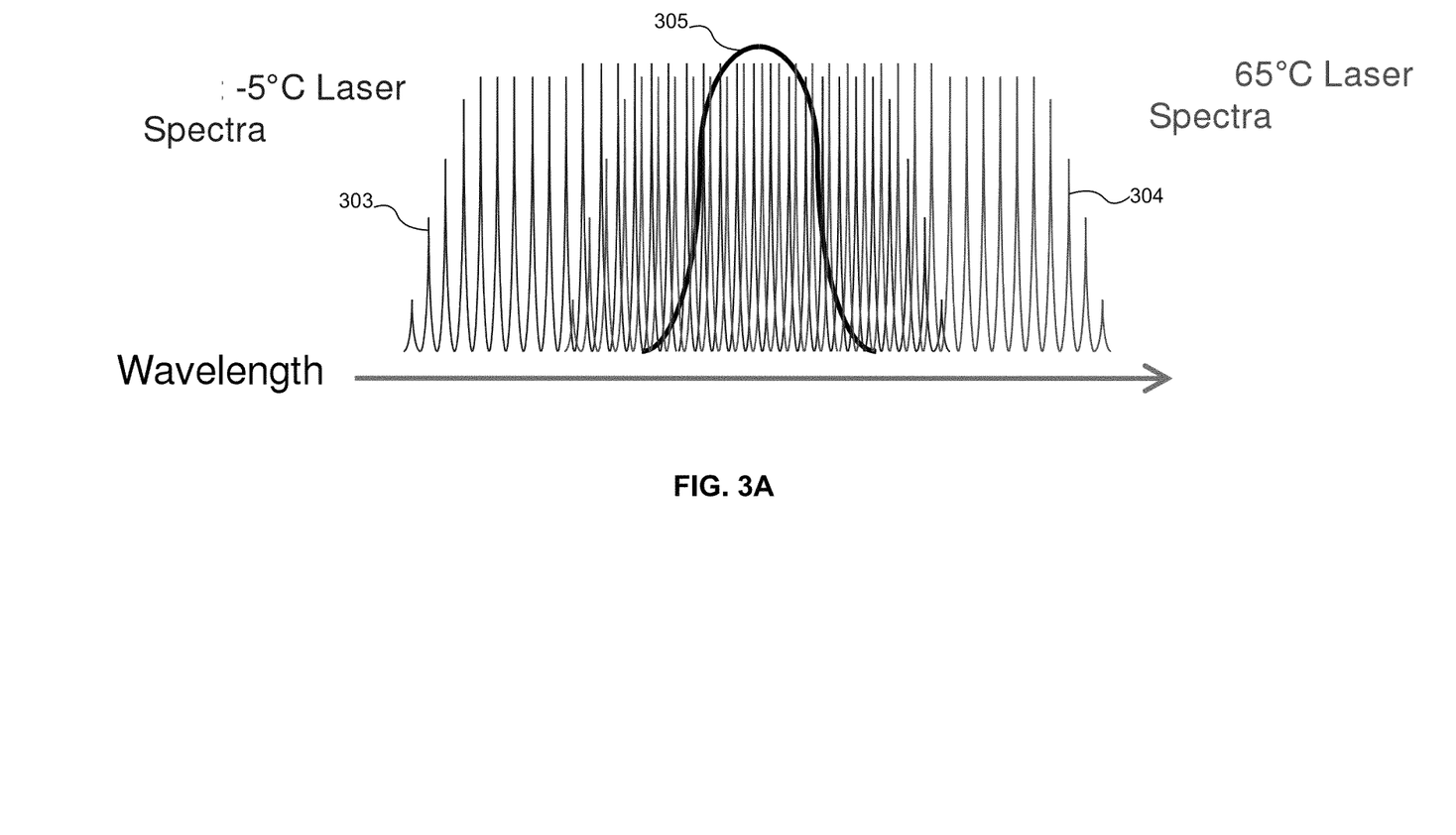
FIG. 3A is a graphical illustration of the spectra shift of an embodiment of an external cavity laser used in an external cavity laser array system.

In some embodiments, the reflection band may have a bandwidth sufficient to accommodate a typical temperature-dependent wavelength shift of the narrow-band exit reflector such that the external cavity laser spectra will cover the associated channel wavelength at any ambient temperature. This may eliminate the need for temperature control in the external cavity laser and greatly reduce the tunable laser cost. In one example, a typical wavelength shift of a DBR is about 1-1.5 nm in the temperature range of −5 to 65° C. If the reflection band is about 2-4 nm (i.e., wide enough to cover 3-5 DWDM channel wavelengths) and the external cavity laser cavity mode spacing is less than 0.05 nm, the FP spectral width will be about the same as the reflector spectra width. FIG. 3A illustrates one example of the spectra shift of the external cavity laser from the spectra 303 at −5° C. to the spectra 304 at 65° C. Thus, the external cavity laser spectra 303, 304 cover the associate channel wavelength 305.

Figure 4:
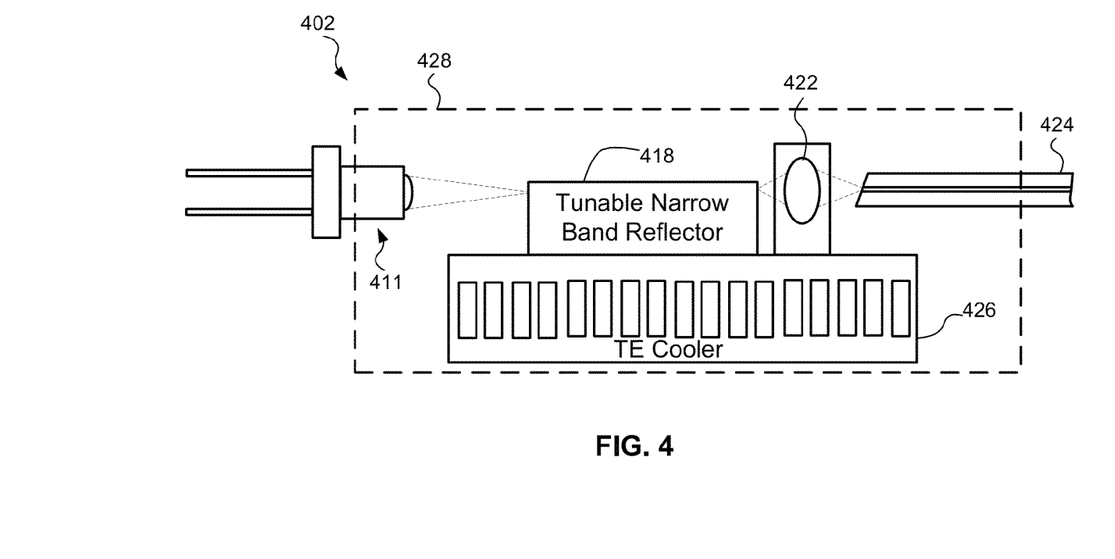
FIG. 4 is a schematic illustration of an external cavity laser including a tunable narrow-band reflector, consistent with another embodiment.

An embodiment of an external cavity laser 402 with a tunable narrow-band reflector 418 is shown and described in greater detail in FIG. 4. This embodiment of the external cavity laser 402 includes a laser package 411 (e.g., a TO can package) optically coupled to the tunable narrow-band reflector 418. The laser package 411 may include, for example, a broad gain, uncooled reflective-semiconductor optical amplifier (R-SOA) for emitting light across a range of wavelengths and a lens for focusing the light on the tunable narrow-band reflector 418. The tunable narrow-band reflector 418 is optically coupled to a waveguide, such as a single mode (SM) optical fiber 424, via a lens 422. The tunable narrow-band reflector 418 is thermally coupled to a temperature controller, such as a thermoelectric (TE) cooler, for controlling the temperature of the tunable narrow-band reflector 418. Thus, the temperature of the tunable narrow-band reflector 418 may be controlled such that the range of wavelengths in the reflection band includes at least the associated channel wavelength. The laser package 411 and optical fiber 424 may be coupled to an enclosure 428 enclosing the reflector 418, lens 422, and TE cooler 426.

Figure 5:
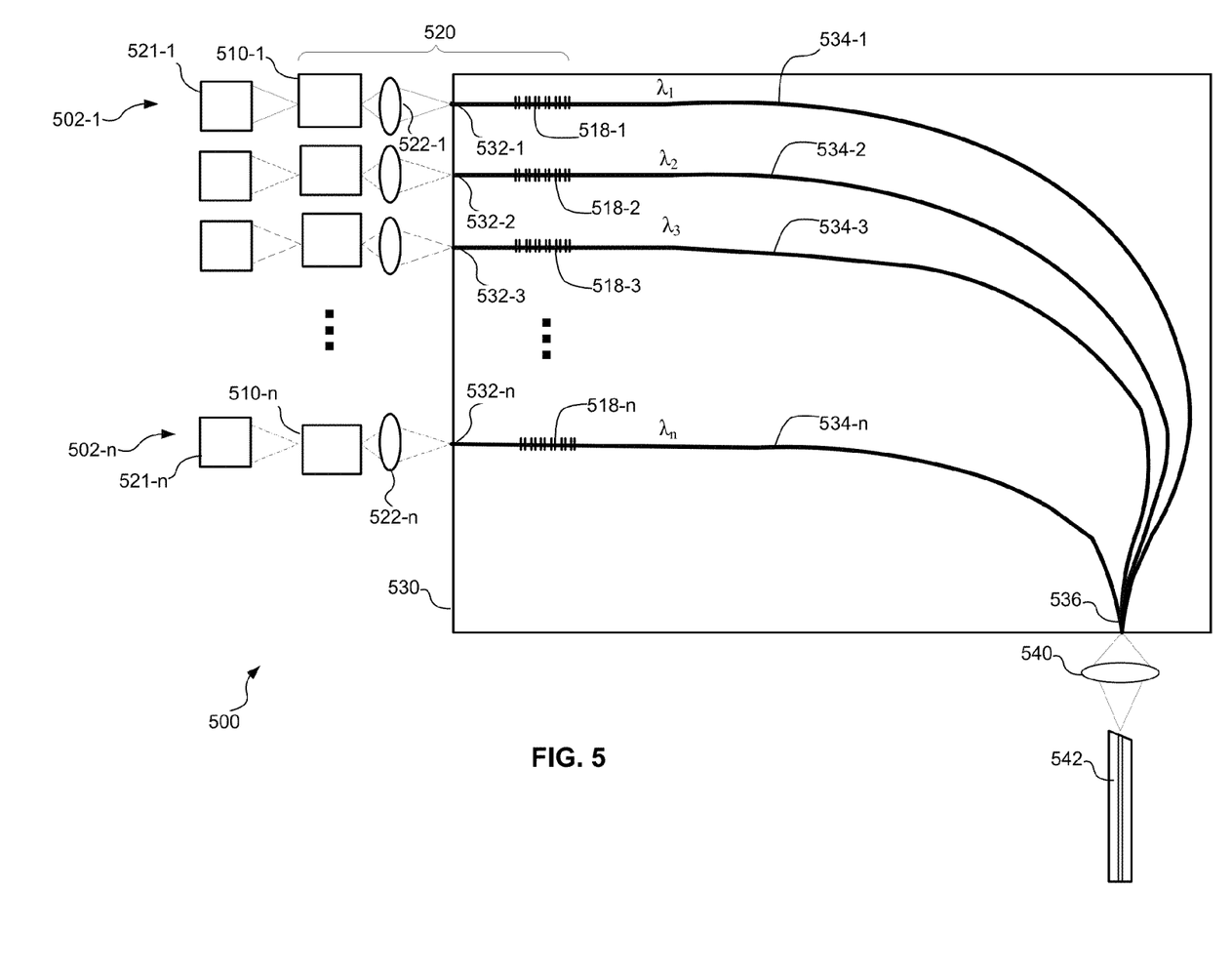
FIG. 5 is a schematic illustration of an external cavity laser array system, consistent with a further embodiment.

Referring to FIG. 5, another embodiment of an external cavity laser array system 500 includes external cavity lasers 502-1 to 502-*n* with the exit reflectors integrated into an AWG 530, which provides both channel wavelength selection and optical multiplexing. The lasers 502-1 to 502-*n* may be associated with different respective channel wavelengths (e.g., $\lambda_1$, $\lambda_2$, ... $\lambda_n$) in a WDM optical system such as a WDM PON. The AWG 530 includes an array of waveguides 534-1 to 534*n* coupled between input ports 532-1 to 532-*n* and an output port 536. The AWG 530 may include existing AWGs that provide the desired channel wavelengths on the respective waveguides 534-1 to 534*n*, effectively filtering the light passing through the AWG 530. When the wavelength selection is provided by an element already present in the WDM-PON network, little if any extra cost is incurred.

The external cavity lasers 502-1 to 502-*n* include laser emitters 510-1 to 510-*n* optically coupled to respective input ports 532-1 to 532-*n* of the AWG 530. In this embodiment, the AWG 530 includes DBR gratings 518-1 to 518-*n* inside respective waveguides 534-1 to 534-*n* proximate the input ports 532-1 to 532-*n* of the AWG 530. The DBR gratings 518-1 to 518-*n* provide the desired wavelength feedback to the respective gain regions of the laser emitters 510-1 to 510-*n*, thereby forming extended lasing cavities 520 between back reflectors on the laser emitters 510-1 to 510-*n* and the DBR gratings 518-1 to 518-*n* acting as exit reflectors. As mentioned above, the DBR gratings 518-1 to 518-*n* may reflect a subset of channel wavelengths within a reflection band including at least the associated channel wavelength such that lasing occurs at the associated channel wavelength.

The AWG 530 filters the laser light at different channel wavelengths for each of the input ports 532-1 to 532-$n$ such that the light passes through each of the waveguides 534-1 to 534$n$ at the different channel wavelengths associated with the respective lasers 502-1 to 502-$n$. The AWG 530 thereby selects the associated channel wavelengths from the one or more channel wavelengths produced by the external cavity lasers 502-1 to 502-$n$ before combining the selected channel wavelengths on the output port 536. The output port 536 of the AGW 530 may be coupled to a waveguide, such as optical fiber 542, for example, using a lens 540.

The AWG 530 may be a dense WDM (DWDM) AWG with thirty-two (32) AWG inputs and waveguides for thirty-two (32) channels, although other AWG configurations with other numbers of channels are within the scope of the present disclosure. Although the example embodiment shows an AWG, the WDM system may also include other types of optical multiplexers capable of filtering light at different channel wavelengths associated with different respective input ports of the optical multiplexer. Also, multiple AWGs may be used to provide the channel wavelength selection.

The DBR gratings 518-1 to 518-$n$ may be manufactured, for example, using holographic interference, e-beam writing, projection photomask, or phase-shift mask. The reflected wavelengths of the DBR gratings 518-1 to 518-$n$ are matched to the individual AWG channels such that the DBR gratings reflect those wavelengths to provide the external feedback to the respective gain regions. In other words, the reflection band of each of the DBR gratings 518-1 to 518-$n$ overlaps with a respective AWG channel wavelength band. If channel 1 is for 1530 nm AWG input, for example, the wavelengths reflected by DBR grating 518-1 should include 1530 nm.

The distances between the laser emitters 510-1 to 510-$n$ and the DBR gratings 518-1 to 518-$n$ are adjustable to adjust effective external cavity lengths, for example, to optimize the effective external cavity length when there is a range of desired effective optical cavity lengths. In one embodiment, the position of one or more of the DBR gratings 518-1 to 518-$n$ in the AWG 530 may be flexibly adjusted to optimize the effective cavity length. In another embodiment, the position of one or more of the laser emitters 510-1 to 510-$n$ may be adjusted to optimize the effective cavity length. In one embodiment, the desired effective cavity length should give a FP mode spacing of less than about 0.1 nm but the total external cavity length should be less than the length of laser traveling distance within the laser modulation frequency. Thus, one advantage of an external cavity laser array system with DBR gratings located within waveguides of an AWG is to facilitate control of the effective cavity length of the external cavity lasers for faster laser operation speed.

Using the laser emitters (e.g., gain chips) with individual DBR gratings providing external wavelength feedback also avoids the need for individual heaters to control the wavelength, for example, as often used when tunable DFB lasers are coupled to an AWG. In one embodiment of the external cavity laser array system, the temperature of the AWG may be controlled to control the laser wavelengths. For example, one or more temperature controllers (e.g., TE coolers and/or heaters) may be thermally coupled to the AWG to provide temperature control. Eliminating individual heaters and temperature control for each of the lasers reduces complexity for the laser package and the total thermal load.

As discussed above the laser emitters 510-1 to 510-$n$ may include gain chips such as reflective-semiconductor-optical-amplifiers (R-SOA), which are capable of emitting light across a wide range of wavelengths. The same laser emitters may thus be used in the transmitters of a WDM system (e.g., in the ONT/ONUs of a WDM-PON) to allow the transmitters to be interchangeable and avoid using tunable lasers. An optical assembly may be used to couple the laser light from the respective laser emitters 510-1 to 510-$n$ into the respective AWG waveguides 534-1 to 534$n$. The optical assembly may include, for example, lenses 522-1 to 522-$n$ that focus the emitted light from the respective laser emitters 510-1 to 510-$n$ into the input ports 532-1 to 532-$n$ of the AWG 530.

The external cavity laser array system 500 may also include monitor photodiodes (MPDs) 521-1 to 521-$n$ for monitoring the light emitted from the laser emitters 510-1 to 510-$n$. The back reflectors of the laser emitters 510-1 to 510-$n$ may be about 80-90% reflectivity to allow a portion of light to pass through the back for sensing by the respective MPDs 521-1 to 521-$n$. The other facets of the laser emitters 510-1 to 510-$n$ may include high quality anti-reflective (AR) coatings such that light passes out of the laser emitters 510-1 to 510-$n$ without reflection for coupling into the respective waveguides.

Accordingly, an external cavity laser array system, consistent with embodiments described herein, is capable of relatively narrow mode spacing and facilitates control of the effective cavity length to provide relatively high speed optical modulation in a WDM optical system. The external cavity laser array system also facilitates control of the lasing wavelengths with reduced complexity.

Consistent with an embodiment, an external cavity laser array system includes a plurality of laser emitters, each of the laser emitters including a gain region for emitting light across a range of wavelengths and a back reflector located at one end thereof. The external cavity laser array further includes an arrayed waveguide grating (AWG) including a plurality of input ports optically coupled to the laser emitters, respectively, an output port, and a plurality of optical waveguides extending from the input ports, respectively, to the output port. The optical waveguides include distributed Bragg reflector (DBR) gratings, respectively, such that extended lasing cavities are formed between the back reflectors of the laser emitters and the DBR gratings, respectively.

Consistent with another embodiment, a wavelength division multiplexed (WDM) optical system is provided for transmitting optical signals at a plurality of system channel wavelengths. The WDM optical system includes a plurality of multi-channel laser emitters, each of the multi-channel laser emitters being associated with an associated channel and channel wavelength and configured to emit multiple channel wavelengths including the associated channel wavelength. Each of the multi-channel laser emitters also includes a gain region for emitting light across a range of wavelengths including the multiple channel wavelengths and a back reflector located at one end thereof. The WDM optical system also includes a plurality of narrow-band reflectors optically coupled to and physically separated from the laser emitters, respectively, forming extended lasing cavities between the back reflectors of the laser emitters and the narrow-band reflectors, respectively, such that the associated channel wavelength for each respective one of the multi-channel laser emitters exits from each respective one the narrow-band reflectors. The WDM optical system further includes an optical multiplexer configured to combine the associated channel wavelengths for the respective transmitters into a multiplexed optical signal.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. An external cavity laser array system comprising: a plurality of laser emitters, each of the laser emitters including a gain region for emitting light across a range of wavelengths and a back reflector located at one end thereof; and an arrayed waveguide grating (AWG) including a plurality of input ports optically coupled to the laser emitters, respectively, an output port, and a plurality of optical waveguides extending from the input ports, respectively, to the output port, wherein the optical waveguides include distributed Bragg reflector (DBR) gratings, respectively, such that extended lasing cavities are formed between the back reflectors of the laser emitters and the DBR gratings, respectively, acting as exit reflectors integrated into the AWG, and wherein each of the optical waveguides of the AWG filters the light at an associated channel wavelength such that the AWG provides both channel selection and optical multiplexing; wherein each of the extended lasing cavities has a length such that a mode spacing of the laser light emitted from each of the lasing cavities is less than about 0.8 nm such that multiple lasing modes fit within respective passbands of the optical waveguides in the AWG.

2. The external cavity laser array system of claim 1 wherein the laser emitters include reflective-semiconductor-optical-amplifiers (R-SOAs).

3. The external cavity laser array system of claim 1 further comprising an optical assembly for optically coupling the emitted light into the respective waveguides of the AWG.

4. The external cavity laser array system of claim 1 wherein each of the DBR gratings has a reflection band overlapping with a respective AWG channel wavelength band of each of the optical waveguides of the AWG.

5. The external cavity laser array system of claim 1 wherein positions of at least some of the laser emitters are adjustable such that distances between the laser emitters and the DBR gratings are adjustable to adjust effective external cavity lengths.

6. The external cavity laser array system of claim 1 wherein a gain region cavity of each of the laser emitters has a length of less than about 1000 μm.

7. The external cavity laser array system of claim 1 wherein at least one of the extended lasing cavities has a length of at least about 9 mm.

8. The external cavity laser array system of claim 1 wherein at least one of the extended lasing cavities has a length such that the mode spacing of the laser light emitted from each of the extended lasing cavities is less than about 0.4 nm such that multiple lasing modes fit within respective passbands of the optical waveguides in the AWG.

9. The external cavity laser array system of claim 1 wherein at least one of the extended lasing cavities has a length such that the mode spacing of the laser light emitted from each of the extended lasing cavities is about 0.1 nm or less such that multiple lasing modes fit within respective passbands of the optical waveguides in the AWG.

10. The external cavity laser array system of claim 1 further comprising a temperature controller thermally coupled to the AWG for tuning the DBR gratings in the AWG.

* * * * *